(12) United States Patent
Sanchez et al.

(10) Patent No.: US 9,406,503 B2
(45) Date of Patent: Aug. 2, 2016

(54) DECREASING THE CRITICAL DIMENSIONS IN INTEGRATED CIRCUITS

(71) Applicants: IMEC VZW, Leuven (BE); Katholieke Universiteit Leuven, KU LEUVEN R&D, Leuven (BE)

(72) Inventors: Efrain Altamirano Sanchez, Kessel-Lo (BE); Farrukh Qayyum Yasin, Leuven (BE); Raven Demeyer, Brugge (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 14/977,146

(22) Filed: Dec. 21, 2015

(65) Prior Publication Data

US 2016/0181090 A1 Jun. 23, 2016

(30) Foreign Application Priority Data

Dec. 19, 2014 (EP) .................................. 14199520

(51) Int. Cl.
| | |
|---|---|
| H01L 21/4763 | (2006.01) |
| H01L 21/02 | (2006.01) |
| H01L 21/311 | (2006.01) |
| H01L 21/324 | (2006.01) |
| H01L 21/027 | (2006.01) |
| H01L 29/06 | (2006.01) |

(52) U.S. Cl.
CPC ...... *H01L 21/02348* (2013.01); *H01L 21/0274* (2013.01); *H01L 21/02282* (2013.01); *H01L 21/31111* (2013.01); *H01L 21/3247* (2013.01); *H01L 29/0649* (2013.01); *H01L 29/0657* (2013.01)

(58) Field of Classification Search
CPC .................. H01L 21/02126; H01L 21/02164; H01L 21/02178; H01L 21/02181; H01L 21/02252; H01L 21/02282; H01L 21/0274; H01L 21/02266; H01L 21/02332; H01L 21/02326
USPC ......... 438/584, 636, 626, 706, 725, 769, 781; 257/E21.006, E21.027, E21.029, 257/E21.032, E21.058, E21.077, E21.231, 257/E21.245, E21.259, E21.267, E21.278, 257/E21.293, E21.311, E21.332
See application file for complete search history.

(56) References Cited

U.S. PATENT DOCUMENTS

| | | | | |
|---|---|---|---|---|
| 7,696,036 B2* | 4/2010 | Bu | .................. | H01L 21/823857 438/216 |
| 8,910,095 B2* | 12/2014 | Li | ........................... | G06F 17/50 716/51 |
| 9,177,795 B2* | 11/2015 | Hendricks | ........... | H01L 21/0273 |
| 2010/0213555 A1* | 8/2010 | Hargrove | .......... | H01L 21/82384 257/411 |
| 2014/0237436 A1 | 8/2014 | Li et al. | | |

* cited by examiner

*Primary Examiner* — David Nhu
(74) *Attorney, Agent, or Firm* — McDonnell Boehnen Hulbert & Berghoff LLP

(57) ABSTRACT

A method for lithographic patterning of a substrate is described. The method comprises obtaining a substrate to be patterned. It further comprises subsequently performing at least twice the following cycle: applying a lithographical patterning process of a thermally shrinkable metal-oxide layer for forming a metal-oxide pattern, and thermally shrinking the metal-oxide pattern. The different metal oxide patterns formed during the at least two cycles are positioned in proximity to each other such that the shrunk metal-oxide patterns form together an overall pattern to be transferred to the substrate. After performing the cycle at least twice, the overall pattern is transferred to the substrate.

20 Claims, 6 Drawing Sheets

DECREASING THE CRITICAL DIMENSIONS IN INTEGRATED CIRCUITS

CROSS-REFERENCE TO RELATED APPLICATION

The present application is a non-provisional patent application claiming priority to European Patent Application No. 14199520.9 filed Dec. 19, 2014, the contents of which are hereby incorporated by reference.

TECHNICAL FIELD

The present disclosure relates to the field of integrated circuits. More specifically, it relates to a method that enables the integration of dense structure in back end of line (BEOL) (Mx) of N7 and beyond technologies of an integrated circuit despite limitations imposed by lithography.

BACKGROUND

As the size of the transistor continues to scale down beyond 193i lithography resolution, the need to engineer new alternatives for patterning which enable smaller critical dimensions (CD) arises. One such technique is the so called triple Litho-Etch (usually abbreviated to LELELE, and sometimes also written as 3×LE or $LE^{3\times}$).

This technique involves dividing the neighboring structures (blocks) into 3 separate lithography masks. U.S. Patent Application Pub. No. 2014/0237436, for example, proposes a layout decomposition for triple patterning lithography. Each structure is printed via lithography exposure, followed by a dry (plasma) etch step which transfers this structure to the core hard mask below the photo-resist stack layers. During this transfer of pattern, the dimension of this pattern needs to be scaled down to the actual critical dimension required. Currently, this scaling down can be done by two different methods.

Two current solutions to shrink the critical dimension of negative tone lithography 3×LE are as follows (applied on an etch stack comprising a target layer, covered by a hard mask, covered by an amorphous carbon layer, covered by a bottom antireflective coating, covered by a photoresist layer):

One solution is by shrinking the litho gap in the photoresist layer by depositing organic layers over the resist after resist development. This way, as the organic layers deposit on the side walls, the critical dimension of the gap reduces as required.

Another solution is where the litho gap is transferred into the bottom antireflective coating. Then, as this gap/pattern is transferred into the amorphous carbon layer, a highly controlled etch process is executed, which tapers the side walls of the core layer, reducing the critical dimension at the bottom of the gap/feature in the core layer.

Both of these techniques need three times the amorphous carbon layers to be deposited and etched to transfer the three lithography patterns into the final hard mask which can be an a-Si layer (above the target layer).

Additionally, both of these techniques need further etch-deposition of hard-mask layers and processing to reverse the gap to a block shape. This is because at the end, blocks in the shape of these gaps are required to be transferred into the dense structures previously created by a multi-patterning process such as SAQP or DSA.

There is still room for improvement.

SUMMARY OF THE DISCLOSURE

Embodiments of the present disclosure provide a method for reducing the feature size in lithographic processing. It is an advantage of embodiments of the present disclosure that feature size can be reduced below sizes obtainable through the 193i photolithography process. The above objective is accomplished by a method and device according to the present disclosure.

The present disclosure relates to a method for lithographic patterning of a substrate, the method comprising obtaining a substrate to be patterned and subsequently performing, at least twice, the following cycle: applying a lithographical patterning process of a thermally shrinkable metal-oxide layer for forming a metal-oxide pattern and thermally shrinking the metal-oxide pattern. As a result, the different metal oxide patterns formed during the at least two cycles are positioned in proximity to each other such that the shrunk metal-oxide patterns form an overall pattern to be transferred to the substrate. After performing the cycle at least twice, the overall pattern is transferred to the substrate.

It is an advantage of embodiments of the present disclosure that the feature size can be reduced below sizes obtainable through a standard photolithography process. The standard photolithography process might, for example, be 193i lithography single exposure. It is an advantage of embodiments of the present disclosure that the pitch can be reduced below 80 nm, below 45 nm, below 37 nm, or even below 22 nm. It is an advantage of embodiments of the present disclosure that the critical dimension (CD) of the metal oxide pattern can be reduced. It is an advantage of embodiments of the present disclosure that the critical dimensions can be reduced by using a simple and cheap thermal shrinking process for a plurality of cycles, rendering the process more simple and cheap compared to, for example, plasma assisted deposition of organic layers to reduce the critical dimensions or compared to a highly controlled etch of multiple amorphous carbon (a-C) core layers to get tapered side walls. It is an advantage of embodiments of the present disclosure that the lithography/etching step results in a pattern of a thermally shrinkable metal-oxide, which only needs to be thermally shrunk to obtain the desired metal-oxide subpattern. It is an advantage of embodiments of the present disclosure that no further etch-deposition steps are required to reverse the gaps to blocks, since the conversion is inherently present in embodiments according to the present disclosure. It is an advantage of embodiments according to the present disclosure that by executing a lithography/etching step with a thermal shrinking step, and by executing this cycle at least twice, smaller than litho-resolution structures can be obtained. It is an advantage of embodiments of the present disclosure that it is possible to execute the lithography/etching/shrinking steps multiple times without the need for depositing the a-C layer before each lithography/etching step.

In one lithographic patterning process, the litho gap in the photoresist layer is shrunk by depositing organic layers over the resist after resist development to reduce the CD of the gap. A second lithography step is only possible after transferring the resulting pattern to the hard mask. Therefore it is required, in this process, to deposit a new a-C layer before starting a new lithography step. This is also the case for another lithographic patterning process in which the smaller CDs are realized by tapered etching through the a-C layer. It is an advantage of embodiments of the present disclosure that transferring the metal-oxide pattern into the substrate (e.g., the core) only needs to be performed once after all lithography/etching/shrinking steps are executed. It is an advantage of embodiments of the present disclosure that the critical dimension of the features in triple Litho-Etch patterning can be scaled down before transferring the complete pattern to the substrate (e.g., the core hard mask layer).

For subsequent cycles, a temperature at which the thermally shrinking of the metal oxide pattern is performed may be equal to or lower than the temperature at which the thermally shrinking is performed in earlier cycles. It is an advantage of embodiments of the present disclosure that thermal shrinking of the metal-oxide pattern may be well controlled. The shrink is reproducible and constant and can be controlled by the temperatures the layer is exposed to. Once shrunk, a subsequent heating step with a temperature lower than or equal to the previous shrinking step does not cause an additional shrinking of the previously shrunk pattern. A higher temperature, on the other hand, causes the pattern to shrink further. The temperature used may be limited by the temperature restrictions of the BEOL.

The metal-oxide material used may be different in at least two of the subsequently applied cycles. It is an advantage of embodiments of the present disclosure that the different thermally shrinkable metal-oxides can have a different etch selectivity. For each of the different metal oxides a different etch chemistry may be used to obtain the required selectivity. In embodiments of the present disclosure where the same etch chemistry is used, the selectivity may not be as high as in embodiments of the present disclosure where a different etch chemistry and different shrinkable metal-oxides are used. Using different metal-oxides and different etch chemistries to increase the selectivity results in different feature heights, which may be used for controlling the overall pattern to be applied.

Applying a lithographical patterning process may comprise applying a metal-oxide using spin-on deposition. It is an advantage of embodiments of the present disclosure that spin-on layers are easy and cheap to deposit, and easy to remove using wet chemistry. It is an advantage of embodiments of the present disclosure that the spin-on layer can be deposited and thermally cycled in a lithography track. In embodiments according to the present disclosure, a cycle including the first lithography/etching step followed by the second shrinking step is executed more than once. After the first lithography, the spin-on metal-oxide hard mask (MHM) is patterned in an etching chamber. Then its thermal cycling can be done in the lithography track where the subsequent spin-on MHM will be deposited. It is an advantage of embodiments of the present disclosure that no need of an extra tool is required for the thermal cycling.

The lithographic patterning may be a triple litho-etch process wherein three subsequent cycles of lithographical patterning and thermally shrinking may be performed. For each of the three subsequent cycles, a different shrinkable metal-oxide may be used, each shrinkable metal-oxide having a critical temperature for shrinking. And in each of the three subsequent cycles, each shrinking temperature may be higher than the critical temperature for shrinking the metal-oxide used in that cycle but lower than the critical temperature for shrinking the metal-oxide(s) used in the previous cycles.

The metal oxide patterns may be positioned proximate to each other while taking into account the shrinking of the metal-oxide so as to obtain structures below the minimum litho-resolution defined by the lithographic process.

When applying a lithographical patterning process of a thermally shrinkable metal-oxide layer, a negative tone photo resist may be used, whereby negative tone lithography exposure is performed.

The lithographical patterning process in at least one cycle may include depositing a negative tone photo-resist layer. It may further include applying the negative tone lithography exposure and developing the negative tone lithography, resulting in a photo-resist layer having a gap. It may further include depositing the metal-oxide layer over the resist layer, thereby filling the gap. Finally, it may also include etching the excess metal-oxide on top of the resist layer and etch-stripping the resist layer, resulting in a pattern of thermally shrinkable metal-oxide.

When applying a lithographical patterning process of a thermally shrinkable metal-oxide layer, a positive tone photo resist may be used, whereby positive tone lithography exposure is performed.

The lithographical patterning process in at least one cycle may comprise depositing the metal-oxide layer, depositing a positive tone photo-resist layer on top of the metal-oxide layer, applying positive tone lithography exposure, resulting in a photo-resist block mask, and dry etching the photo-resist block, resulting in the pattern of thermally shrinkable metal-oxide.

Providing a substrate may comprise providing a target layer, covered by a hard mask, covered by an amorphous carbon layer, covered by a bottom antireflective coating.

The method may comprise transferring the metal-oxide pattern to the substrate by etching the bottom antireflective coating and then etching the amorphous carbon layer. It is an advantage of embodiments of the present disclosure that multiple metal-oxide patterns (provided by multiple lithography/etching/shrinking cycles) can be etched into the bottom anti-reflective coating and into the amorphous carbon layer simultaneously.

The present disclosure further relates to a chip made using a method as described above. It is an advantage of embodiments of the present disclosure that chips can be made with a pitch below 80 nm, below 45 nm, below 37 nm, or below 22 nm.

Particular and preferred aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described herein.

DETAILED DESCRIPTION

Figure 1:
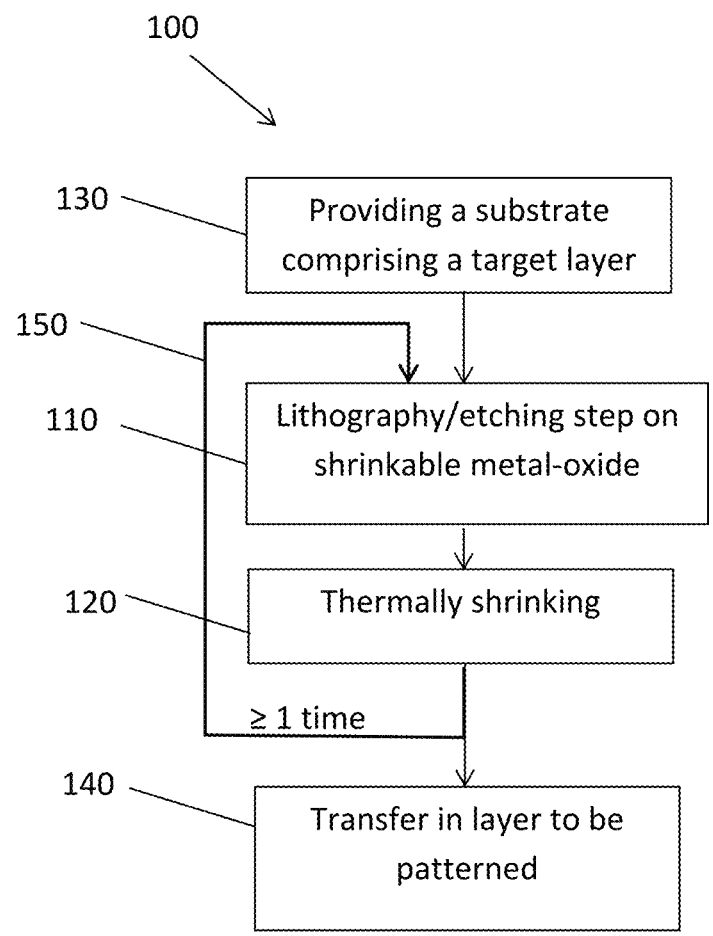
FIG. 1 illustrates a flow chart of a method according to an embodiment of the present disclosure.

The present disclosure is described with respect to particular embodiments and with reference to certain drawings but the disclosure is not limited thereto but only by the claims. The drawings described are only illustrative and are non-limiting. In the drawings, the size of some of the elements may be exaggerated and not drawn to scale for illustrative purposes. The dimensions and the relative dimensions do not correspond to actual reductions to practice of the disclosure.

Furthermore, the terms first, second, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, under, above, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noted that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order to not obscure an understanding of this description.

Where in embodiments according to the present disclosure reference is made to "a cycle," reference is made to a sequence of steps at least comprising a lithography/etching step followed by a shrinking step.

Where in embodiments according to the present disclosure reference is made to "the memory block A," reference is made to the metal-oxide pattern made by the first lithography/etching step and to the shrunk version after the first shrinking step (e.g., the metal-oxide pattern made in the first cycle).

Where in embodiments according to the present disclosure reference is made to "the memory block B," reference is made to the metal-oxide pattern made by the second lithography/etching step and to the shrunk version after the second shrinking step (e.g., the metal-oxide pattern made in the second cycle).

Where in embodiments according to the present disclosure reference is made to "the memory block C," reference is made to the metal-oxide pattern made by the third lithography/etching step and to the shrunk version after the third shrinking step (e.g., the metal-oxide pattern made in the third cycle).

In a first aspect, embodiments of the present disclosure relate to a method 100 for lithographically patterning a substrate. The lithographically patterning typically includes multiple lithography and etching steps. The method comprises obtaining a substrate to be patterned. It further comprises subsequently performing, at least twice, the following cycle: applying a lithographical patterning process of a thermally shrinkable metal-oxide layer to form a metal-oxide pattern, and thermally shrinking the metal-oxide pattern. The different metal oxide patterns formed during the at least two cycles are outlined relatively with respect to each other so that the shrunk metal-oxide patterns form together an overall pattern to be transferred to the substrate. After performing the cycle at least twice, the overall pattern is transferred to the substrate.

The above features and further optional features and advantages will further be discussed with reference to particular embodiments below, the present disclosure not being limited thereby and thereto.

One embodiment of the method comprises providing a substrate. The substrate may be prepared upfront. In particular embodiments, the substrate may comprise a supporting layer, a target layer 250, covered by a hard mask 240, covered by an amorphous carbon layer 230, covered by a bottom antireflective coating (BARC) 220. Alternatively, the substrate may be any suitable substrate for which one wants to pattern an upper layer, where the upper layer may also be referred to as a target layer or target structures. The term "substrate" may further include any underlying material or materials that may be used, or upon which a device may be formed. In other alternative embodiments, the "substrate" may include a semiconductor substrate, such as a silicon, gallium arsenide (GaAs), gallium arsenide phosphide (GaAsP), indium phosphide (InP), germanium (Ge), or silicon germanium (SiGe) substrate. The "substrate" may include, for example, an insulating layer, such as a SiO2 or a Si3N4 layer in addition to a semiconductor substrate portion. Thus, the term substrate also includes silicon-on-glass and silicon-on-sapphire substrates. The term "substrate" is thus used to define generally the elements for layers that underlie a layer or portions of interest, further comprising the layer that is to be patterned. The term substrate may refer to the layer(s) comprising any target structure in the BEOL multi-processes. The substrate thus typically may comprise a target layer.

According to embodiments of the present disclosure, one or more metal-oxide 301 materials are used. Such metal-oxide materials may be applied using spin-on deposition, which can be done in the litho track. Different types of metal-oxides may be used. An example list of metal-oxides on which thermally controlled shrink is applicable includes: Aluminum Oxide ($AlO_x$), Tantalum Oxide ($TaO_x$), Hafnium Oxide ($HfO_x$), Silicon and Titanium Oxide mixture [(Si—Ti)$O_x$], Titanium Oxide ($TiO_x$), Zirconium Oxide ($ZrO_x$), and Tungsten Oxide ($WO_x$). The metal-oxide may be selected from this list. This list, however, is not exhaustive, and any other thermally shrinkable metal-oxide may be used. It is an advantage of embodiments of the present disclosure that it is possible to thermally shrink the metal-oxide in a controlled way, and that etching materials exist to which the metal-oxide is selective. Some examples of etching materials and processes are given below, embodiments not being limited thereto. The metal-oxide (e.g., $AlO_x$) may be etched using $BCl_3$ plasma. The plasma may be HBr plasma, in which $AlO_x$ before thermal shrink etches at the rate of 6 nm/min, while after thermal shrink it does not etch in HBr at all. The plasma may be $CF_4$ plasma, in which $TaO_x$ before thermal shrink etches at up to 11 times faster (at an etch rate of 45 nm/min) than thermally shrunk $AlO_x$ (an $AlO_x$ layer, which has been thermally treated at 550° C. etches at 4 nm/min). Etching can be done using a $Cl_2$ based plasma etch, in which $HfO_2$ etches 3 times faster (at an etch rate of 36 nm/min) than thermally shrunk $TaO_x$ and 5 times faster than thermally shrunk $AlO_x$.

In embodiments according to the present disclosure, a different metal-oxide may be used during different cycles. The materials may be selected such that there is a different etching selectivity for each of the metal-oxide materials. In an example embodiment according to the present disclosure, three cycles might be performed. In a first cycle, metal-oxide A (e.g., $AlO_x$) is deposited. In a second cycle, metal oxide B (e.g., $TaO_x$) is deposited. And in a third cycle, metal-oxide C (e.g., SiTiOx or $HfO_x$) is deposited.

In this example embodiment, a first memory block may be formed by $AlO_x$, which may, after lithography, be patterned with Cl2/BCl3 at etch rates higher than 50 nm/min. Then this block may be shrunk to the desired dimensions by thermal treatment. Then a second memory block of $TaO_x$ may be formed following the same sequence, but this time the etching chemistry may be SF6/He, which provides an etch rate of >90 nm/min and a selectivity 60:1 to $AlO_x$. A third memory block may be made of $SiTiO_x$ etched with a chemistry of HBr/He, which provides an etch rate of >30 nm/min, a selectivity of 5:1 to Ta, and an infinite selectivity to $AlO_x$. For example, if the etch rate of metal-oxide B is approximately 90 nm/min, and the etch rate of metal-oxide A is 1.6 nm/min, then the selectivity of B to A is 90:1.6, or approximately 60:1. If the etch rate of metal-oxide C is approximately 26 nm/min, and the etch rate of metal-oxide A is 0, then the selectivity of C to A is 26:0, or infinite. And if the etch rate of metal-oxide C is approximately 26 nm/min, and the etch rate of metal-oxide B is 5 nm/min, then the selectivity of C to B is 26:5, or approximately 5:1.

After spin-on deposition, the metal-oxide may be baked at approximately 200° C. for stabilization and solidification. When exposing the metal-oxide (e.g., selected from the above list) to temperatures of up to 550° C., preferably between 200° C. and 350° C., it can shrink up to 55% of the original thickness. Therefore it is an advantage of embodiments of the present disclosure that the critical dimension (CD) of patterned blocks/features shrink up to 50% as well when made of a thermally shrinkable metal-oxide. The shrink percentage depends on the metal-oxide used, on the applied temperature, and on the duration of the heating. The shrink percentage can therefore be controlled by these parameters. In an example embodiment of the present disclosure, the metal-oxide is an aluminum oxide which is thermally shrunk at 350° C. to reduce its volume to 65% of its original volume. The minimal time typically may be 90 seconds. The thermal budget limitation for BEOL may be 400° C.

In embodiments according to the present disclosure, the shrinking temperature during the first cycle is typically higher than or equal to the shrinking temperature applied during the second cycle. In general, the shrinking temperature applied during a cycle is higher than or equal to the shrinking temperature applied during a subsequent cycle. It is thereby an advantage of embodiments of the present disclosure that shrinking of a metal-oxide during a subsequent cycle does not cause the previous metal-oxide, which was applied and shrunk during a previous cycle, to shrink. This is because in order to shrink an already shrunk metal-oxide, it must be exposed to a higher temperature than in the previous shrink step.

FIG. 1 shows a flow chart illustrating a method according to the present disclosure. In the first process step 130, a substrate (e.g., a substrate comprising an etch stack 200, 500) is provided. In step 110, lithography/etching is applied, resulting in a metal-oxide 301 pattern. Thereafter the metal-oxide pattern is shrunk in the thermally shrinking step 120. This thermal shrinking can be done in the lithography track.

As illustrated by feedback arrow 150, the cycle comprising the lithography/etching step 110 and the thermal shrinking step 120 is executed at least twice. For example, executing the cycle two times results in a double Litho-Etch (abbreviated to 2×LE, or LELE, or $LE^{2\times}$), three times results in a triple Litho-Etch (abbreviated to 3×LE, or LELELE, or $LE^{3\times}$), and four times results in a quadruple Litho-Etch.

After etching, thermal shrinking step 120 can be done in the lithography track where the subsequent metal-oxide layer can be deposited. By subsequently executing a lithography/etching step 110 with a thermal shrinking step 120, and by executing this cycle at least twice, smaller than litho-resolution structures may be obtained. After executing the cycle the first time, a first metal-oxide pattern with reduced size is realized, the reduced size being realized by thermally shrinking the metal-oxide. Because of the reduced size of the shrunk first metal-oxide pattern 302 it is possible to add, during the second cycle, a pattern of a thermally shrinkable metal-oxide

401 closer to the first metal-oxide pattern 302 than would be possible without the shrinking step. Therefore it is an advantage of embodiments of the present disclosure that smaller than minimum litho-resolution structures with tight pitches can be printed using, for example, LELELE/3×LE/LE$^{3\times}$. The different blocks in the different steps are first created and shrunk, and thereafter the pattern is transferred.

In embodiments according to the present disclosure the overall metal-oxide pattern is, after the different cycles have been performed, transferred to the substrate in step 140 by etching the bottom antireflective coating 220 and then the amorphous carbon (a-C) layer 230. Step 140 is performed after executing the lithography/etching 110 and thermal shrinking 120 steps. This step is also illustrated in FIG. 1.

In embodiments according to the present disclosure, either negative tone lithography or positive tone lithography exposure is performed, as will be illustrated further below with reference to different examples.

In embodiments according to the present disclosure the process window can be enlarged by using different metal-oxides between the different cycles. Thereby the selectivity of the metal-oxide with regard to the etching means can be increased. This allows more variation of the process parameters, as the etching is performed selectively, and this results in an enlarged process window compared to embodiments of the present disclosure whereby the same metal-oxide is used in each cycle. It is possible to take advantage of the etching selectivity of the different metal-oxides. This can, for example, be used in embodiments where the thermal budget is limited. In order to protect the already shrunk blocks in such embodiments during the patterning of a subsequent block, one can make use of etch selectivity. This is not the case when using identical metal-oxides, in which case the selectivity during each cycle must be realized by thermal treatment of the metal-oxides. When using identical metal-oxides, the earlier shrunk blocks are made hard and etch resistant through the thermal treatment, such that the shrunk blocks are not affected by the etch step used to pattern the subsequent block.

In a particular example, when different metal oxides are used, an additional layer underlying the different metal oxide blocks is provided. The layer typically has similar n and k values as the photoresist, e.g., the photoresist on top of the BARC. The layer may for example be $SiO_2$ with dopants such as C, H, or N for tuning the n and k values. Such an underlying layer may be an optically transparent layer for the 193 nm wavelength.

Below, further examples are described making use of different types of photoresist and/or making use of the same or different metal-oxide materials in the different cycles. These examples illustrate possible implementations of the present disclosure, embodiments not being limited thereto.

Figure 2:
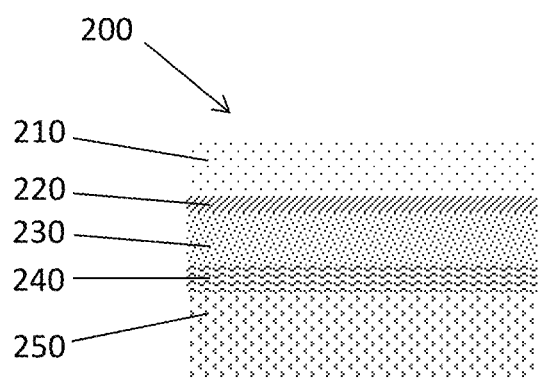
FIG. 2 illustrates an etch stack used in a method according to an embodiment of the present disclosure.

In one embodiment, a method is illustrated wherein a negative tone photoresist is used. In this embodiment, an etch stack 200 is provided in a provision step. This stack (e.g., a 3×LE stack) comprises a target layer 250, covered by a hard mask 240, covered by an amorphous carbon (e.g., $SiOC_x$) layer 230 as the core layer, covered by a bottom antireflective coating 220, covered by a negative tone photo-resist 210. An illustration thereof is shown in FIG. 2.

The provision step is followed by a lithography/etching step 110. In embodiments according to the present disclosure, negative tone lithography exposure 311 is performed, resulting in a photo-resist layer 210 having a gap in the shape of the final required structure, but bigger in size than required as illustrated by step 312 in FIG. 3. During the lithography/etching step 110, a spin-on metal-oxide layer 301 (also referred to as the memory layer) is deposited over the resist layer, thereby filling the gap in the photo-resist layer 210 as illustrated by step 313 in FIG. 3. The surface of the metal-oxide is planarized due to its spin-on deposition method. Thereafter, the excess metal-oxide on top of the resist layer is etched, and the resist layer is etch-stripped, resulting in a pattern of thermally shrinkable metal-oxide 301 as illustrated by step 314 in FIG. 3. The metal-oxide on top of the resist layer may be etched using a dry etch step (e.g., using $BCL_3$ plasma), leaving behind metal-oxide material (memory block A) 301 in the gap of the resist layer.

The lithography/etching step is followed by a shrinking step 120, thermally shrinking the metal-oxide 301 (the memory block A), resulting in a shrunk memory block A 302.

Thereafter, the cycle of lithography/etching 110 and thermal shrinking 120 is repeated at least once. Whereby, at the start of the lithography/etching step, a new photo-resist layer 210 is applied, covering the shrunk memory block A 302, and a lithography exposure is performed as illustrated by step 311 in FIG. 4. After development of the photo-resist layer 210, a gap is created in the photo-resist layer as illustrated by step 312 in FIG. 4. This gap is filled with metal-oxide in the metal-oxide spin-on step as illustrated by step 313 in FIG. 4. After removing excess metal-oxide and the photo-resist, the metal-oxide 401 may be thermally shrunk, resulting in a new thermally shrunk pattern of metal-oxide 402. Since the metal-oxide material only shrinks to a certain percentage of its starting dimension, further exposure to the shrink temperature does not shrink the already shrunk memory block A 302 (memory block A would only shrink if the thermal treatment went above the maximum temperature it was exposed to when shrinking it during the first cycle). Each lithography/etching 110 and thermal shrinking 120 cycle results in a thermally shrunk pattern of metal-oxide.

Figure 3:
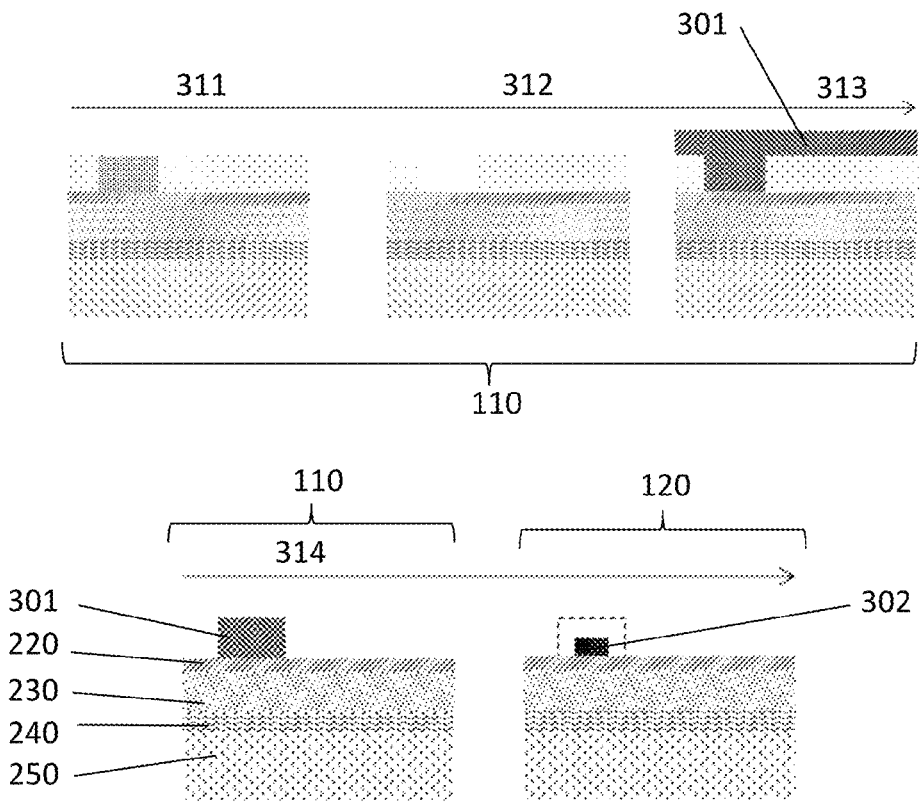
FIG. 3 illustrates process steps, including negative tone lithography, etching, and shrinking, in a method according to an embodiment of the present disclosure.

An example of a first cycle is shown in FIG. 3. It shows a sequence of a litho-exposure step 311, a litho-development step 312, a metal-oxide spin on step 313, and an etch back of the metal-oxide and photo-resist removal step 314 resulting in a memory block A 301. The photo-resist removal step is followed by a thermal shrinking step 120 resulting in a shrunk memory block A 302.

Figure 4:
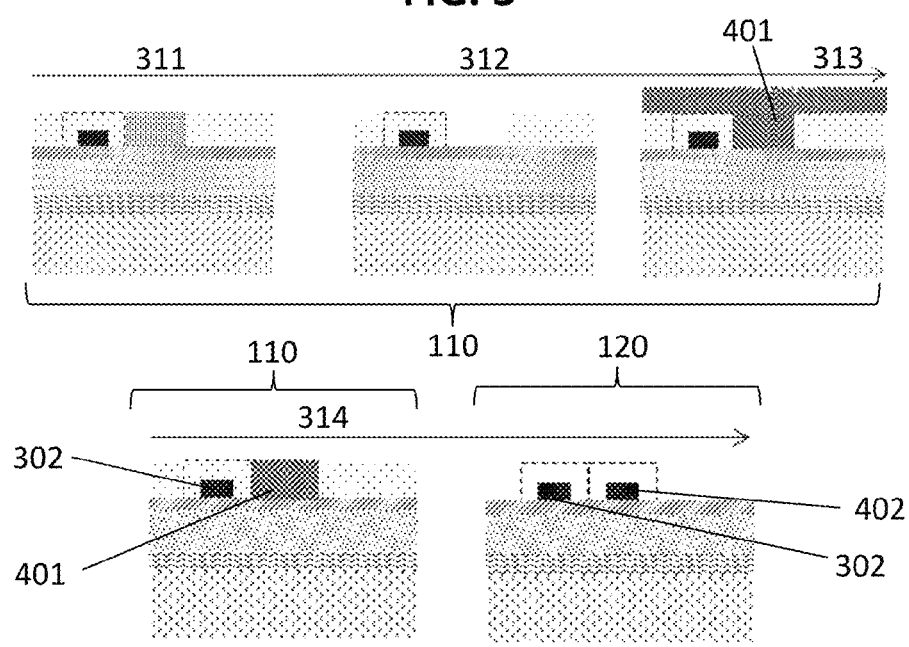
FIG. 4 illustrates a second cycle, including negative tone lithography, etching, and shrinking, in a method according to an embodiment of the present disclosure.

An example of a second cycle is shown in FIG. 4. After applying a new photo-resist layer, a litho-exposure step 311 is done, followed by the same steps as in FIG. 3, resulting in a memory block B 401. After thermal shrinking, a shrunk memory block B 402 is formed.

Figure 11:
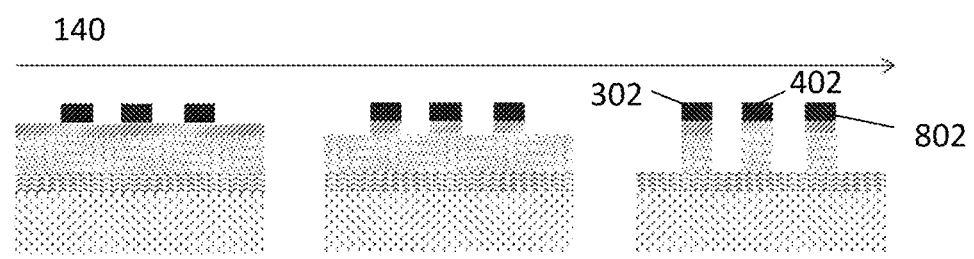
FIG. 11 illustrates process steps, including transferring the metal-oxide pattern into the BARC layer and into the a-C core, in a method according to an embodiment of the present disclosure.

The cycle may be repeated three times, leaving shrunk memory blocks A 302, B 402, and C 802 shown in FIG. 11. However, in alternative embodiments, the cycle may be repeated more or fewer than three times.

Figure 5:
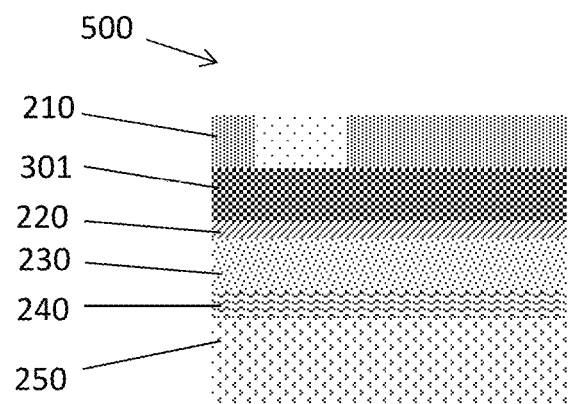
FIG. 5 illustrates an etch stack used in a method according to an embodiment of the present disclosure.

In another embodiment, a method is illustrated wherein a positive tone photoresist is used. In embodiments according to the present disclosure, an etch stack 500 is provided. This stack (e.g., a 3×LE stack) comprises, from the bottom target layer going up to the top resist layer, a bottom stack of target etch layer 250, covered by a hard mask layer 240 used for the final patterning, covered by an amorphous carbon (e.g., $SiOC_x$) layer 230 as the core layer, covered by a bottom antireflective coating 220, covered by a spin-on metal-oxide layer 301 (e.g., $AlO_x$), covered by a photoresist layer (210). An illustration thereof is shown in FIG. 5.

Figure 6:
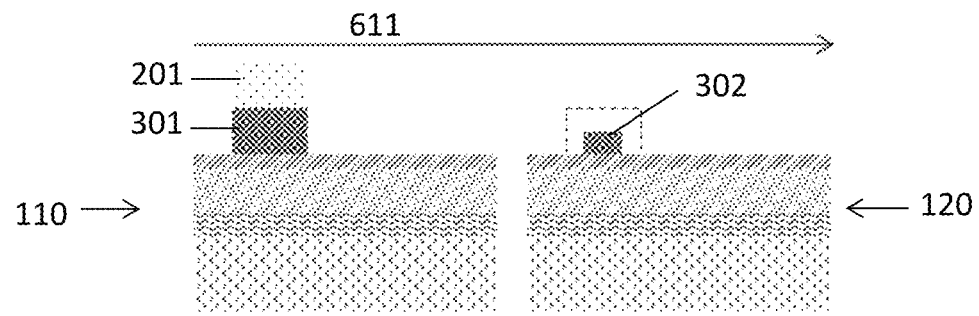
FIG. 6 illustrates process steps in a method according to an embodiment of the present disclosure.

The provision step is followed by a lithography/etching step 110. In embodiments according to the present disclosure, positive tone lithography exposure is performed. This leaves a photo-resist block 201 in the shape of the final required structure, but bigger in size than required. This photo-resist block may be transferred to the memory layer via dry etch 611 (e.g., using $BCl_3$ plasma for an $AlO_x$ layer), creating the memory block A 301 corresponding to the first lithography mask-set. An example embodiment thereof is shown in FIG. 6.

The lithography/etching step 110 is followed by a shrinking step 120, thermally shrinking the metal-oxide 301 by exposing the stack to thermal treatment, which shrinks the memory block A to the required size 302. An example thermal shrinking step is illustrated as step 120 in FIG. 6.

Figure 7:
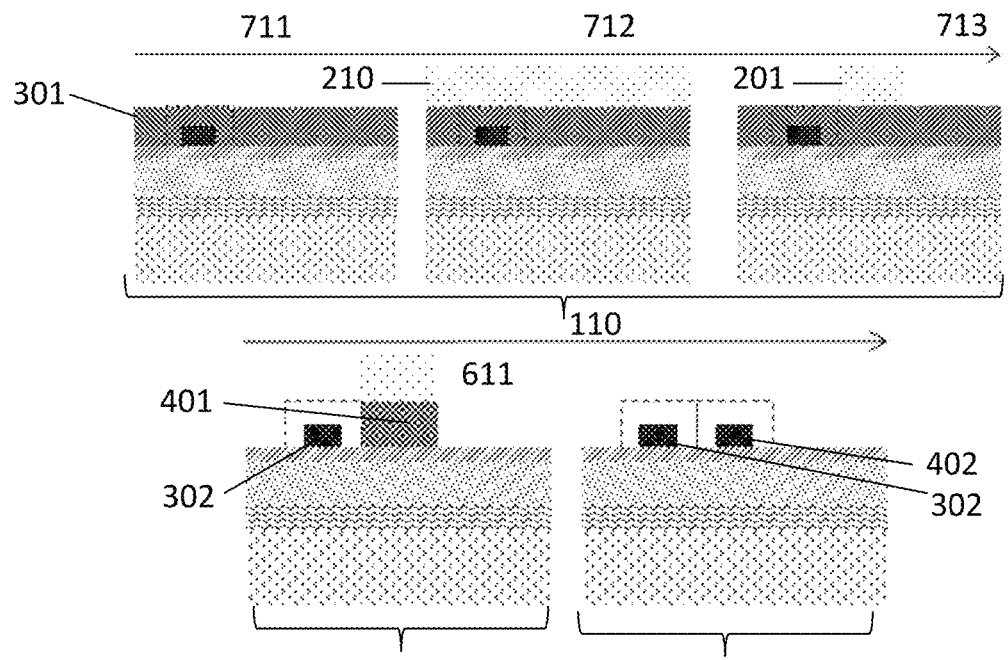
FIG. 7 illustrates a second cycle, including positive tone lithography, etching, and shrinking, in a method according to an embodiment of the present disclosure.

Thereafter, the cycle of lithography/etching 110 and thermal shrinking 120 is repeated at least once. Whereby, at the start of the second cycle, a second memory layer using the same metal-oxide 301 is spin-coated onto the stack. The spin-coated metal-oxide layer thereby covers the already shrunk memory block A. An example thereof is shown in step 711 of FIG. 7. Next, the second photoresist layer 210 is deposited as shown in step 712 of FIG. 7, and a second lithography exposure is performed. After development of the photo-resist layer 210, the second photo-resist block 201 is formed in the second photo-resist layer. An example thereof is shown in step 713 of FIG. 7. Next the second photo-resist block 201 is transferred into the second memory layer using a plasma chemistry to which shrunk memory block A 302 is selective (has a lower etch rate). This is illustrated in step 611 of FIG. 7. The plasma may be HBr plasma, in which $AlO_x$ before thermal shrink etches at the rate of 6 nm/min, while after thermal shrink it does not etch in HBr at all. After the second lithography/etching step 110, memory block B 401 is created, corresponding to the second lithography mask-set.

The lithography/etching step 110 is followed by a shrinking step 120. In this step, memory block B is thermally shrunk to the required size by exposing the stack to thermal treatment, resulting in shrunk memory block B 402. Since memory block A was already shrunk during the shrinking step of the first cycle (step 120 illustrated in FIG. 6), it does not shrink further in this step.

Figure 8:
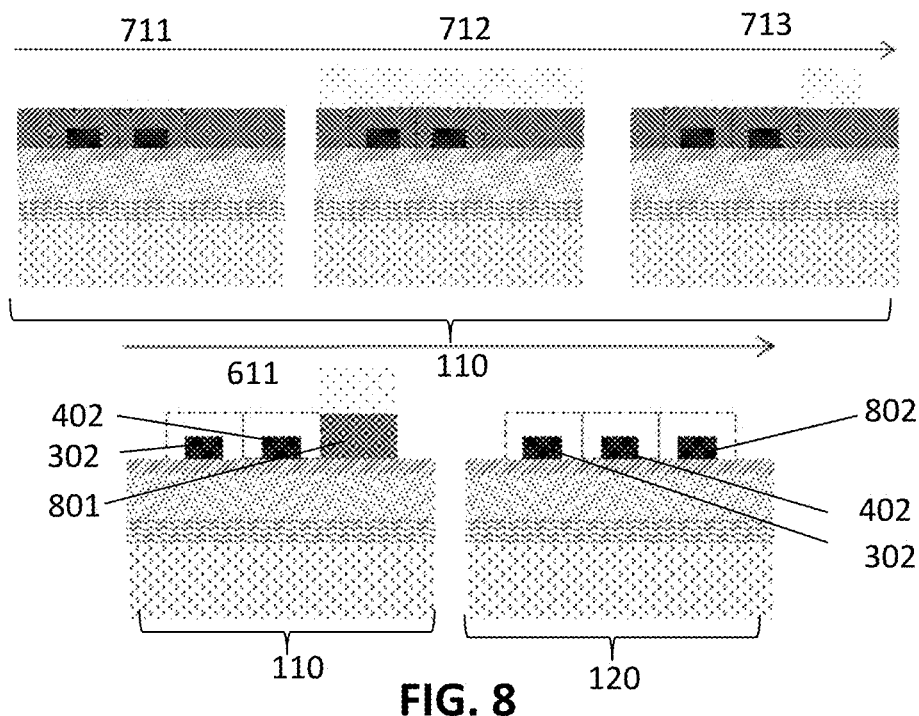
FIG. 8 illustrates a third cycle, including positive tone lithography, etching, and shrinking, in a method according to an embodiment of the present disclosure.

In embodiments according to the present disclosure the cycle of lithography/etching 110 and thermal shrinking 120 is performed at least once. For example, the cycle may be performed three times. In a third cycle, the process begins with a third spun-on memory layer deposition, ends with a third shrunk memory block C, and follows the above described sequence comprising metal-oxide spin-on deposition 711, photo-resist deposition 712, lithography 713, litho etch into memory 611 and thermal shrinking 120. This creates shrunk memory block C 802 corresponding to a third lithography mask-set. An example of these steps is illustrated in FIG. 8 in which the memory block C 801 and shrunk memory block C 802 can be seen.

In another embodiment, a method is described using positive tone photoresist, but different metal-oxide layers are used in the different cycles. An etch stack 500 is provided in a provision step, after which during a lithography/etching step 110 positive tone lithography exposure is performed, resulting in a photo-resist block in the shape of the final required structure, but bigger in size than required. The photo-resist block is transferred to the memory layer via litho-etching. The metal-oxide layer may be an $AlO_x$ layer which may be etched using $BCl_3$ plasma. Thereby memory block A 301 is created corresponding to the first lithography mask-set. An example embodiment thereof is illustrated by step 611 of FIG. 6.

The lithography/etching step 110 is followed by a shrinking step 120. The metal-oxide 301 is thermally shrunk by exposing the stack to thermal treatment, which shrinks the memory block A to the required size 302. An example thermal shrinking step is illustrated by step 120 in FIG. 6.

Figure 9:
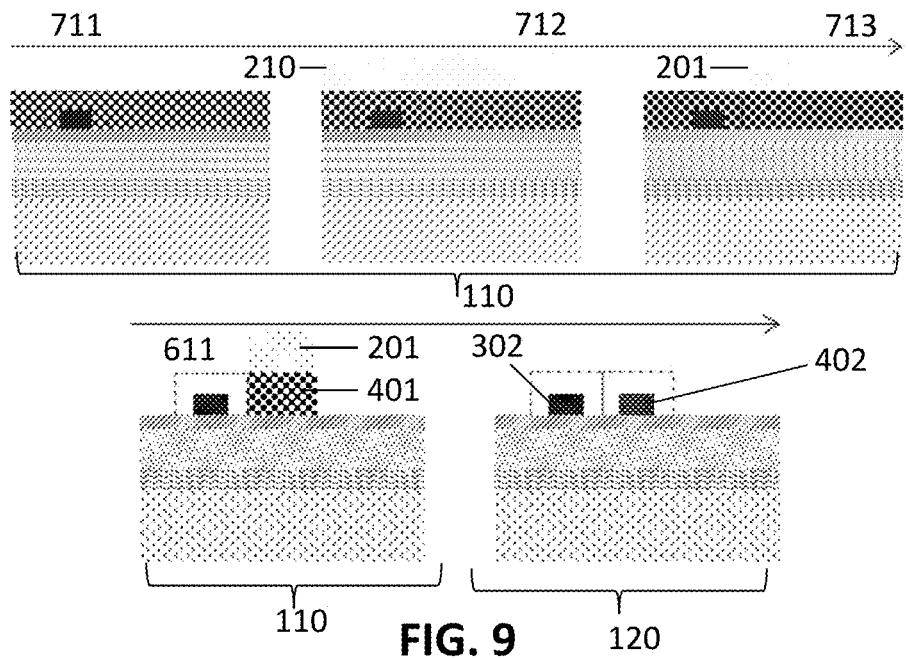
FIG. 9 illustrates a second cycle including positive tone lithography, etching, and shrinking, whereby a different metal-oxide is used than in the first cycle, in a method according to an embodiment of the present disclosure.

Thereafter, the cycle of lithography/etching 110 and thermal shrinking 120 is repeated at least once. Whereby, at the start of the second cycle a second memory layer using a second type of metal-oxide is spin-coated onto the stack as shown by step 711 in FIG. 9. Next, the second photoresist layer 210 is deposited as shown by step 712 in FIG. 9, and the second lithography exposure is performed. After development of the photo-resist layer 210, the second photo-resist block 201 is formed from the second photo-resist layer as shown by step 713 in FIG. 9. Next, the second photo-resist block 201 is transferred into the second memory layer using a plasma chemistry to which shrunk memory block A 302 is selective (has a lower etch rate). This is illustrated by step 611 of FIG. 9. The plasma may be $CF_4$ plasma, in which the second memory layer (e.g., $TaO_x$) before thermal shrink etches at up to 11 times faster (at an etch rate of 45 nm/min) than shrunk memory block A 302 ($AlO_x$) which has been thermally shrunk (an $AlO_x$ layer thermally treated at 550° C. etches at 4 nm/min). This creates memory block B 401 corresponding to the second lithography mask-set.

The lithography/etching step 110 is followed by a shrinking step 120. The memory block B is thermally shrunk to a desired size (shrunk memory block B 402) by exposing the stack to thermal treatment. Since shrunk memory block A 302 was already shrunk during the shrinking step of the first cycle (step 120 illustrated in FIG. 6), it does not shrink further in this step.

Figure 10:
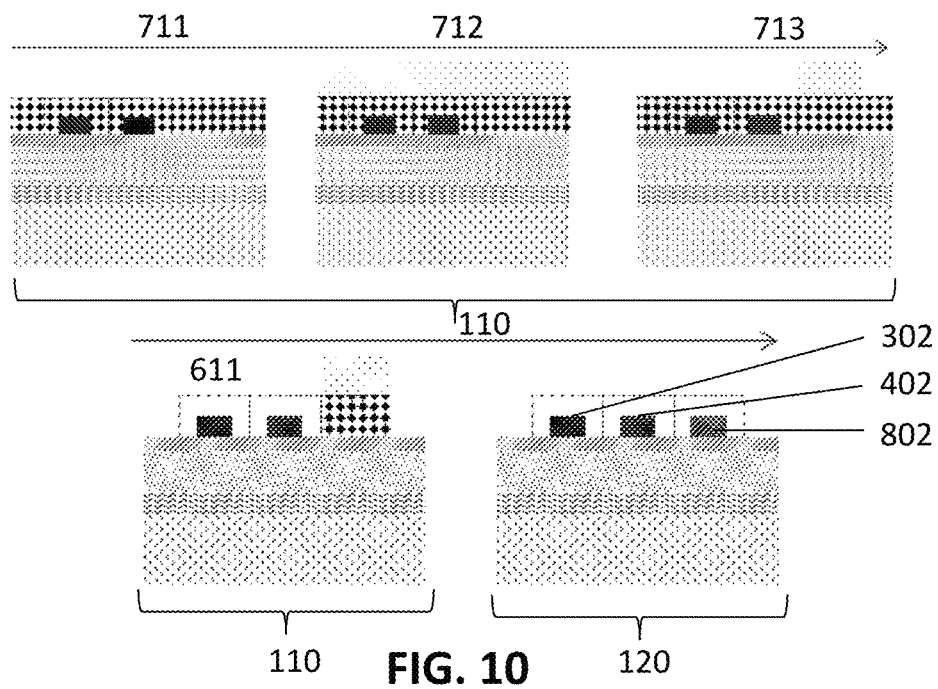
FIG. 10 illustrates a third cycle, including positive tone lithography, etching, and shrinking, whereby a different metal-oxide is used than in the first cycle and the second cycle, in a method according to an embodiment of the present disclosure.

In embodiments according to the present disclosure, the cycle of lithography/etching 110 and thermal shrinking 120 is performed at least once. For example, the cycle may be performed three times. In a third cycle, the process begins with a third spin-on memory layer deposition, ends with shrunk memory block C, and follows the above described sequence comprising metal-oxide spin-on deposition 711, photo-resist deposition 712, lithography 713, litho-etch into memory 611, and thermal shrinking 120. This creates memory block C 801 corresponding to a third lithography mask-set. An example of these steps is illustrated in FIG. 10. In embodiments according to the present disclosure, the third metal-oxide may be different from the metal-oxide used in a previous cycle. The metal-oxide may, for example, be $HfO_x$.

The third photo-resist block transfer to the third memory layer can be done using $Cl_2$ based plasma etch (an example thereof is illustrated by step 611 in FIG. 10). It is thereby an advantage of embodiments of the present disclosure that $HfO_2$ etches three times faster (at an etch rate of 36 nm/min) than thermally shrunk $TaO_x$ and five times faster than thermally shrunk $AlO_x$ in $Cl_2$ plasma. This creates memory block C 801 corresponding to a third lithography mask-set. An example of these steps is illustrated in FIG. 10.

The lithography/etching step 110 is followed by a shrinking step 120. The memory block C is thermally shrunk to a desired size (shrunk memory block C 802) by exposing the stack to thermal treatment. Since memory block A and B were already shrunk during the shrinking step of the first cycle and second cycle, they do not shrink further in this step.

After completing the cycles comprising a lithography/etching step 110 followed by a shrinking step 120, the metal-oxide pattern is transferred into the substrate by etching the bottom antireflective coating 220 and then the amorphous carbon (a-C) layer as illustrated by FIG. 11. This may be done using a highly anisotropic $O_2$ based plasma etch which was the requirement of LE3× technique. In FIG. 11, the left scheme shows three memory blocks on top of the BARC. The middle scheme shows the three memory blocks etched into the BARC. The right scheme shows the three memory blocks etched into the amorphous carbon layer.

Figure 12:
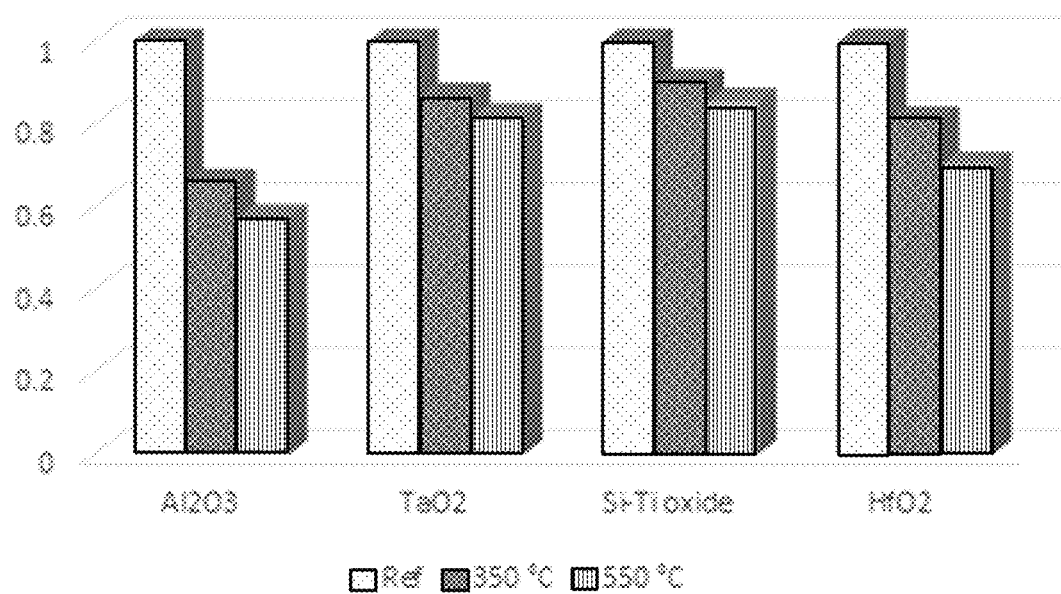
FIG. 12 illustrates the normalized thickness as a function of temperature for different metal oxides that can be used in embodiments of the present disclosure.

As indicated above, the shrinkage of different metal-oxides is controllable by heating the metal-oxide up to a certain temperature. This is illustrated in FIG. 12. This figure shows for different metal-oxides (Al2O3, TaO2, Si—Ti oxide, and HfO2) the normalized thickness after thermal treatment. For each metal-oxide three bars are shown. The left bar is the reference bar showing the normalized thickness of the metal-oxide before being submitted to thermal treatment. The middle bar shows the normalized thickness of the metal-oxide after thermal treatment at a temperature of 350° C. And the right bar shows the normalized thickness of the metal-oxide after thermal treatment at a temperature of 550° C. In embodiments according to the present disclosure, the shrink percentage of the metal-oxides can therefore be controlled by the temperature during thermal treatment. This temperature may be different for the different metal-oxides to obtain the desired shrink percentage.

In some embodiments according to the present disclosure, accurate aligning of the different blocks is performed. This may be done by using metal-oxide blocks that are transparent to 193 nm radiation.

In another aspect, embodiments of the present disclosure relate to a chip made using a method in accordance with the present disclosure. In embodiments according to the present disclosure, the method 100 for patterning a substrate can be used to create cut and block masks for front end of line features (FEOL) in combination with spacer aligned quadruple patterning (SAQP) of fins (in FinFET technology). It is thereby an advantage that the methods disclosed herein can be used at 22 nm and below. In embodiments according to the present disclosure, the method 100 for patterning a substrate can be used to create back end of line (BEOL) features, and again be used as cut/block mask for self-aligned double patterning (SADP) and SAQP.

By way of illustration, embodiments of the present disclosure not being limited thereto, some example thermal stresses are illustrated for $Al_2O_3$ and for $TaO_2$ respectively in Table 1 and Table 2 below. The tables also illustrate the effect of thermal treatment on the etch resistance of the material.

TABLE 1

|  | as deposited thickness | after thermal cycling | as deposited etch rates (nm/min) | after thermal cycling |
| --- | --- | --- | --- | --- |
| @ 350deg C. (60 sec) | | | | |
| BCl3 (150 V) | 37.6 | 25.3 | 67.2 | 20.4 |
| Cl2 | 37.6 | 24.8 | 10.4 | 3.6 |
| CF4 | 37.3 | 24.7 | 12.8 | 2.8 |
| SF6 | 37.6 | 24.4 | 6.4 | 1.6 |
| HBr | 37.3 | 24.5 | 6.0 | 0.0 |
| NFS | 37.8 | 24.7 | 13.2 | 2.4 |
| @ 550deg C. (60 sec) | | | | |
| BCl3 (150 V) | 35.2 | 21.4 | 67.2 | 13.2 |
| Cl2 | 35.9 | 21.5 | 10.4 | 7.2 |
| CF4 | 36.2 | 19.6 | 12.8 | 4.0 |
| SF6 | 36.7 | 19.6 | 6.4 | 3.2 |
| HBr | 36.9 | 21.5 | 6.0 | 0.0 |
| NFS | 37.4 | 21.7 | 13.2 | 6.8 |

TABLE 2

|  | as deposited thickness | after thermal cycling | as deposited etch rates (nm/min) | after thermal cycling |
| --- | --- | --- | --- | --- |
| @ 350deg C. (60 sec) | | | | |
| BCl3 (150 V) | 26.8 | 24.3 | 74.4 | 43.2 |
| Cl2 | 27.6 | 24.2 | 21.6 | 12.8 |
| CF4 | 27.9 | 24.1 | 44.8 | 39.6 |
| SF6 | 31.0 | 25.0 | 87.3 | 40.0 |
| HBr | 28.1 | 23.8 | 5.6 | 5.2 |
| NF3 | 29.0 | 24.0 | 64.0 | 55.2 |
| @ 550deg C. (60 sec) | | | | |
| BCl3 (150 V) | 29.2 | 24.4 | 74.4 | 45.6 |
| Cl2 | 29.5 | 24.3 | 21.6 | 11.6 |
| CF4 | 29.0 | 24.2 | 44.8 | 38.8 |
| SF6 | 29.5 | 24.3 | 87.3 | 35.2 |
| HBr | 32.9 | 26.4 | 5.6 | 6.8 |
| NF3 | 34.4 | 26.8 | 64.0 | 60.8 |

What is claimed is:

1. A method for lithographic patterning of a substrate, comprising:
   providing a substrate to be patterned;
   applying to the substrate a first thermally shrinkable metal-oxide layer;
   etching the first thermally shrinkable metal-oxide layer to form a first metal-oxide pattern;
   thermally shrinking the first metal-oxide pattern;
   applying to the substrate a second thermally shrinkable metal-oxide layer;
   etching the second thermally shrinkable metal-oxide layer to form a second metal-oxide pattern;
   thermally shrinking the second metal-oxide pattern, wherein the thermally shrunk first and second metal-oxide patterns form an overall pattern on the substrate; and
   etching exposed areas of the substrate that are not covered by the overall pattern.

2. The method of claim 1, wherein the second metal-oxide pattern is thermally shrunk at a lower temperature than the first metal-oxide pattern.

3. The method of claim 1, wherein the first thermally shrinkable metal-oxide layer comprises a first metal-oxide and the second thermally shrinkable metal-oxide layer comprises a second metal-oxide different from the first metal-oxide.

4. The method of claim 1, wherein the first thermally shrinkable metal-oxide layer is applied to the substrate by spin-on deposition.

5. The method of claim 1, further comprising:
   applying to the substrate a third thermally shrinkable metal-oxide layer;
   etching the third thermally shrinkable metal-oxide layer to form a third metal-oxide pattern; and
   thermally shrinking the third metal-oxide pattern, wherein the overall pattern includes the thermally shrunk first, second, and third metal-oxide patterns.

6. The method of claim 5, wherein the first thermally shrinkable metal-oxide layer comprises a first metal-oxide with a first critical shrinking temperature, the second thermally shrinkable metal-oxide layer comprises a second metal-oxide with a second critical shrinking temperature, and the third thermally shrinkable metal-oxide layer comprises a third metal-oxide with a third critical shrinking temperature, wherein the second metal-oxide is different from the first metal-oxide and the third metal-oxide is different from the first and second metal-oxides, and wherein the second critical shrinking temperature is lower than the first critical shrinking temperature and the third critical shrinking temperature is lower than the second critical shrinking temperature.

7. The method of claim 1, wherein the first and second metal-oxide layers are etched by performing a lithographic process, wherein the lithographic process has a minimum litho-resolution, wherein the second thermally shrunk metal-oxide pattern is separated from the first thermally shrunk metal-oxide pattern by a distance, wherein the distance is smaller than the minimum litho-resolution.

8. The method of claim 1, wherein etching at least one of the first or second thermally shrinkable metal-oxide layers comprises performing negative tone lithography.

9. The method of claim 8, wherein etching at least one of the first or second thermally shrinkable metal-oxide layer comprises:
depositing a negative tone photo-resist layer on the substrate;
performing negative tone lithography to create a gap in the negative tone photo-resist layer;
depositing the respective first or second thermally shrinkable metal-oxide layer over the negative tone photo-resist layer, thereby filling the gap;
etching the respective first or second thermally shrinkable metal-oxide located on top of the negative tone photo-resist layer; and
etch-stripping the negative tone photo-resist layer.

10. The method of claim 1, wherein etching at least one of the first or second thermally shrinkable metal-oxide layers comprises performing positive tone lithography.

11. The method of claim 10, wherein etching at least one of the first or second thermally shrinkable metal-oxide layer comprises:
depositing a positive tone photo-resist layer on top of the respective first or second thermally shrinkable metal-oxide layer;
performing positive tone lithography to create a photo-resist block mask in the shape of the respective first or second metal-oxide pattern; and
etching the exposed surface of the respective first or second thermally shrinkable metal-oxide layer.

12. The method of claim 1, wherein providing the substrate comprises providing a target layer, wherein the target layer is covered by a hard mask, wherein the hard mask is covered by an amorphous carbon layer, and wherein the amorphous carbon layer is covered by a bottom antireflective coating.

13. The method of claim 12, wherein etching exposed areas of the substrate that are not covered by the overall pattern comprises etching the bottom antireflective coating and the amorphous carbon layer.

14. A chip produced by a process comprising:
providing a substrate;
applying to the substrate a first thermally shrinkable metal-oxide layer;
etching the first thermally shrinkable metal-oxide layer to form a first metal-oxide pattern;
thermally shrinking the first metal-oxide pattern;
applying to the substrate a second thermally shrinkable metal-oxide layer;
etching the second thermally shrinkable metal-oxide layer to form a second metal-oxide pattern;
thermally shrinking the second metal-oxide pattern, wherein the thermally shrunk first and second metal-oxide patterns form an overall pattern on the substrate; and
etching exposed areas of the substrate that are not covered by the overall pattern.

15. The chip of claim 14, wherein the second metal-oxide pattern is thermally shrunk at a lower temperature than the first metal-oxide pattern.

16. The chip of claim 14, wherein the first thermally shrinkable metal-oxide layer comprises a first metal-oxide and the second thermally shrinkable metal-oxide layer comprises a second metal-oxide different from the first metal-oxide.

17. The chip of claim 14, wherein the first thermally shrinkable metal-oxide layer is applied to the substrate by spin-on deposition.

18. The chip of claim 14, wherein the process further comprises:
applying to the substrate a third thermally shrinkable metal-oxide layer;
etching the third thermally shrinkable metal-oxide layer to form a third metal-oxide pattern; and
thermally shrinking the third metal-oxide pattern, wherein the overall pattern includes the thermally shrunk first, second, and third metal-oxide patterns.

19. The chip of claim 18, wherein the first thermally shrinkable metal-oxide layer comprises a first metal-oxide with a first critical shrinking temperature, the second thermally shrinkable metal-oxide layer comprises a second metal-oxide with a second critical shrinking temperature, and the third thermally shrinkable metal-oxide layer comprises a third metal-oxide with a third critical shrinking temperature, wherein the second metal-oxide is different from the first metal-oxide and the third metal-oxide is different from the first and second metal-oxides, wherein the second critical shrinking temperature is lower than the first critical shrinking temperature and the third critical shrinking temperature is lower than the second critical shrinking temperature.

20. The chip of claim 14, wherein the first and second metal-oxide layers are etched by performing a lithographic process, wherein the lithographic process has a minimum litho-resolution, wherein the second thermally shrunk metal-oxide pattern is separated from the first thermally shrunk metal-oxide pattern by a distance, and wherein the distance is smaller than the minimum litho-resolution.

* * * * *